United States Patent
Yang et al.

(10) Patent No.: US 9,880,216 B2
(45) Date of Patent: Jan. 30, 2018

(54) LOCKING CONFIRMATION DEVICE OF MULTIPLE ELECTRODE CONTACTS AND LOCKING CONFIRMATION DEVICE FOR DETECTING FAULT ELECTRODE CONTACTS OF NODES OF MULTIPLE ELECTRODES

(71) Applicant: Aleees Eco Ark Co. Ltd, Bade, Taoyuan County (TW)

(72) Inventors: Antzu Yang, Bade (TW); Anthony Antao Yang, Bade (TW); Gordon Ching Chen, Bade (TW)

(73) Assignee: ALEEES ECO ARK (CAYMAN) CO. LTD., Grand Cayman (KY)

( * ) Notice: Subject to any disclaimer, the term of this patent is extended or adjusted under 35 U.S.C. 154(b) by 88 days.

(21) Appl. No.: 15/029,864

(22) PCT Filed: Oct. 16, 2013

(86) PCT No.: PCT/CN2013/085338
§ 371 (c)(1),
(2) Date: Apr. 15, 2016

(87) PCT Pub. No.: WO2015/054852
PCT Pub. Date: Apr. 23, 2015

(65) Prior Publication Data
US 2016/0252560 A1 Sep. 1, 2016

(51) Int. Cl.
*H01M 10/48* (2006.01)
*G01R 31/04* (2006.01)
(Continued)

(52) U.S. Cl.
CPC .......... *G01R 31/043* (2013.01); *G01L 5/243* (2013.01); *G01R 31/006* (2013.01);
(Continued)

(58) Field of Classification Search
CPC .............. H01M 10/48; H01M 10/425; H01M 2010/4271; H01M 10/4285;
(Continued)

(56) References Cited

U.S. PATENT DOCUMENTS 2,449,057 A * 9/1948 Clayden ................. H01R 11/24
324/538
4,792,762 A * 12/1988 Shiina ................. G01R 31/3627
324/426
(Continued)

FOREIGN PATENT DOCUMENTS

CN 101769952 7/2010
CN 101799033 8/2010
(Continued)

*Primary Examiner* — Jermele M Hollington
*Assistant Examiner* — Taqi Nasir
(74) *Attorney, Agent, or Firm* — Kirton McConkie; Evan R. Witt

(57) ABSTRACT

A locking confirmation device of multiple electrode contacts includes an electrode, a terminal bolt, a sensing unit and a positioning bolt. The electrode includes an electrode thread and a positioning thread. The terminal bolt is used for locking a conductor and the electrode thread. The terminal bolt includes a positioning recess. The sensing unit includes an insulated cover, a first contact, a second contact, an elastic member and an voltage signal input connector. When the elastic member is extruded, a circuit is formed for returning a voltage signal of a node of the electrode. The positioning bolt is used for fixing a detection sensor assembly on the positioning thread. When a head portion of the positioning bolt is received within the positioning recess, the terminal bolt is led to a locking state by the head portion of the positioning bolt. Therefore, a fault of an electricity system is prevented.

5 Claims, 5 Drawing Sheets

(51) Int. Cl.
*G01L 5/24* (2006.01)
*G01R 31/00* (2006.01)
*H01M 2/20* (2006.01)
*H01M 2/30* (2006.01)
*H01M 10/42* (2006.01)

(52) U.S. Cl.
CPC .......... *G01R 31/045* (2013.01); *H01M 2/206* (2013.01); *H01M 2/305* (2013.01); *H01M 10/425* (2013.01); *H01M 10/4207* (2013.01); *H01M 10/482* (2013.01); *H01M 10/488* (2013.01); *H01M 2220/20* (2013.01)

(58) Field of Classification Search
CPC .......... H01M 10/482; H01M 2220/20; H01M 2250/20; B65G 1/0492; B65G 1/137; B65G 15/00; B65G 1/0464; B65G 1/0478; B65G 1/1378; B65G 2814/03
USPC .......... 324/756.05, 538, 426, 433, 430, 444, 324/347, 358, 370, 447–449
See application file for complete search history.

(56) References Cited

U.S. PATENT DOCUMENTS

| | | | | |
|---|---|---|---|---|
| 5,089,772 A | * | 2/1992 | Hatada | G01R 1/0735 324/756.05 |
| 5,108,305 A | * | 4/1992 | Suzuki | H01R 13/642 29/881 |
| 5,477,140 A | * | 12/1995 | Sato | G01R 31/045 324/538 |
| 5,490,798 A | * | 2/1996 | Murakami | G01R 31/04 324/750.25 |
| 2002/0051907 A1 | * | 5/2002 | Wakata | G01R 31/3696 429/178 |
| 2009/0169347 A1 | * | 7/2009 | Teng | B25J 5/00 414/401 |
| 2010/0309949 A1 | * | 12/2010 | Akaboshi | H01M 2/1077 374/45 |
| 2012/0280692 A1 | * | 11/2012 | Park | H01M 2/206 324/426 |

FOREIGN PATENT DOCUMENTS

| | | |
|---|---|---|
| CN | 101908656 | 12/2010 |
| CN | 202117103 | 1/2012 |
| CN | 102763243 | 10/2012 |
| CN | 202495555 | 10/2012 |
| CN | 202562957 | 11/2012 |
| CN | 102826019 | 12/2012 |
| CN | 102322983 | 1/2013 |
| CN | 103101489 | 5/2013 |
| CN | 103283062 | 9/2013 |
| JP | 2002050342 | 2/2002 |
| JP | 2010160930 | 7/2010 |
| JP | 2010282816 | 12/2010 |
| JP | 2011249307 | 12/2011 |
| JP | 2012531722 | 12/2012 |
| JP | 2013005509 | 1/2013 |
| KR | 20100130943 A | 12/2010 |
| KR | 20120080315 A | 7/2012 |
| WO | 2008095315 | 8/2008 |

* cited by examiner

LOCKING CONFIRMATION DEVICE OF MULTIPLE ELECTRODE CONTACTS AND LOCKING CONFIRMATION DEVICE FOR DETECTING FAULT ELECTRODE CONTACTS OF NODES OF MULTIPLE ELECTRODES

FIELD OF THE INVENTION

The present disclosure relates to a locking confirmation device of multiple electrode contacts utilizing a detection sensor assembly for detection, and more particularly to a device of confirming the locking state through the stability of the signal of the detection sensor assembly. The locking confirmation device is especially useful in the field of electric vehicles since a large amount of battery modules are usually connected together for powering in this field. A related terminal bolt is affected by the vibration of the electric vehicle.

BACKGROUND OF THE INVENTION

Hundreds of batteries are usually utilized by the battery module of a large electric vehicle, in series or in parallel. In most assembling methods, since it is hard to accurately lock every electrode contacts, a risk of loosening always exists in this type of the battery module. However, when the electric vehicle is moving, the batteries are continuously affected by the continuous vibration of the electric vehicle. That is, when the electric vehicle is operated in a long-time operation, the electrode contacts may be loosened, thereby causing high voltage arcs or sparks. Therefore, there is a need of providing a locking confirmation device to ensure the safety of the battery module.

SUMMARY OF THE INVENTION

The present disclosure provides a locking confirmation device. The locking confirmation device includes a detection sensor assembly used for returning the voltage information of batteries and the locking states of the electrode contacts of a battery module. In particular, the locking confirmation device is especially applied to an electric vehicle, which is continuously vibrated.

It is the primary object of the present invention to provide a locking confirmation device of multiple electrode contacts. When the electrode contacts are possibly loosened, a user will be noticed to execute a detection to avoid a fault of an electricity system of an electric vehicle.

The secondary object of the present invention provides a locking confirmation device of multiple electrode contacts. The locking states of the electrode contacts and the voltage information of batteries can be transmitted to a battery management unit by the locking confirmation device.

Another object of the present invention provides a locking confirmation device that can detect the locking states of different electrodes having the same potential through at least a detection sensor assembly of a battery management unit.

In accordance with an aspect of the present disclosure, there is provided a locking confirmation device of multiple electrode contacts including an electrode, a terminal bolt, a sensing unit and a positioning bolt. The electrode includes an electrode thread and a positioning thread. The terminal bolt is used for locking a conductor and the electrode thread. The terminal bolt includes a positioning recess. The sensing unit includes an insulated cover, a first contact, a second contact, an elastic member and an voltage signal input connector. When the elastic member is extruded, a circuit is formed for returning a voltage signal of a node of the electrode. The positioning bolt is used for fixing a detection sensor assembly on the positioning thread. When a head portion of the positioning bolt is received within the positioning recess, the terminal bolt is led to a locking state by the head portion of the positioning bolt.

In accordance with another aspect of the present disclosure, the locking confirmation device further includes an extra detection sensor assembly of an extra electrode. The extra electrode and the electrode have the same potential.

In accordance with another aspect of the present disclosure, the locking confirmation device further includes at least a bias resistor for forming a voltage divider circuit. When the elastic member is not extruded, an unique drop voltage signal is transmitted to a battery management component.

In accordance with another aspect of the present disclosure, the locking confirmation device further includes a control unit for identifying fault electrode contacts through measuring the unique drop voltage signal.

In accordance with another aspect of the present disclosure, there is provided a locking confirmation device for detecting fault electrode contacts of nodes of multiple electrodes comprising at least two detection sensor assemblies and a voltage signal input connector. Each detection sensor assembly comprises an insulation assembly, a first contact, a second contact and an elastic member. When the elastic member is extruded by a locking of a positioning bolt and a related terminal bolt, a circuit is formed for conducting the first contact and the second contact.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

Figure 1:
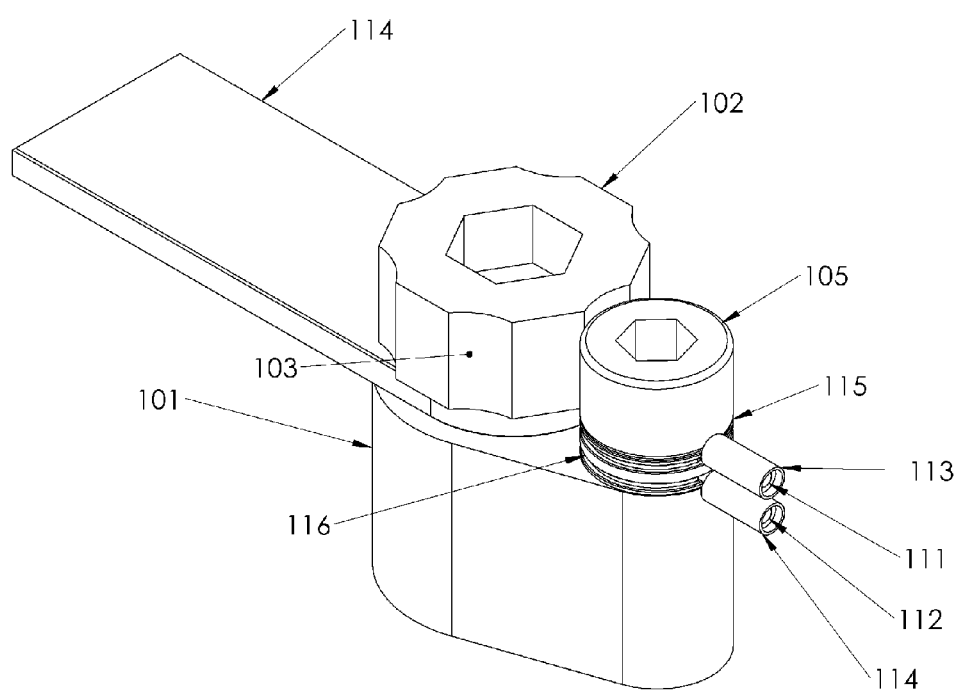
FIG. 1 schematically illustrates an isometric view of a locking confirmation device according to the first embodiment of the present invention.

Hereinafter, a locking confirmation device of multiple electrode contacts according to the first embodiment of the present invention will be illustrated with reference to FIGS. 1-3. The locking confirmation device includes an electrode 101, a terminal bolt 102, a positioning recess 103, an electrode thread 104, a positioning bolt 105, a positioning thread 106, a conductor 110, a first contact 111, a second contact 112, a first insulated sleeve 113, a second insulated sleeve 114, an insulated cover and an elastic spacer 116.

Figure 2:
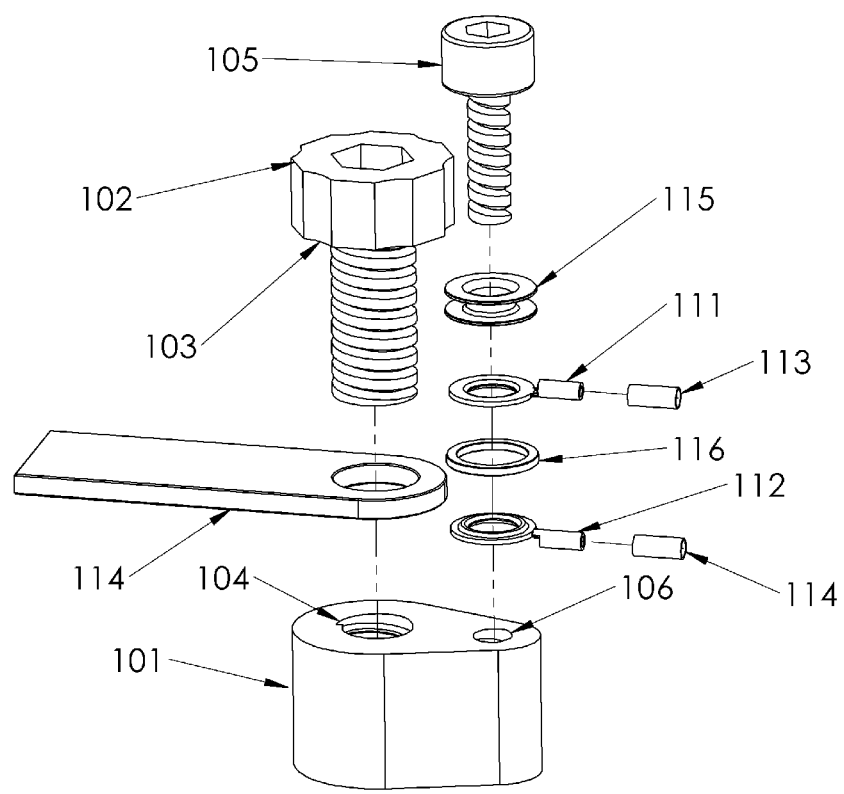
FIG. 2 schematically illustrates an exploded view of the locking confirmation device according to the first embodiment of the present invention.
Figure 3:
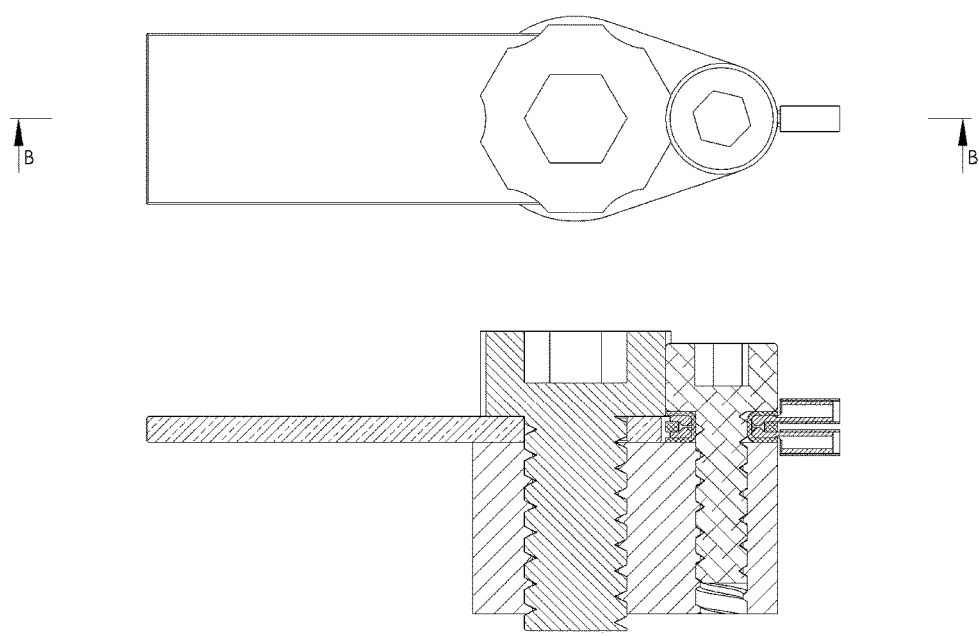
FIG. 3 schematically illustrates a sectional view of the locking confirmation device according to the first embodiment of the present invention.

As shown in FIG. 2, the electrode includes the electrode thread 104 and the positioning thread 106.

The conductor 110 is locked on the electrode 101 through the terminal bolt 102. The terminal bolt 102 is adjusted to a position for aligning the positioning recess 103 and the positioning thread 106, thereby installing the positioning bolt 105.

The positioning bolt 105 is used for fixing a detection sensor assembly on the positioning thread 106.

The sensing unit includes the insulated cover 115, the first contact 111, the second contact 112 and the elastic spacer 116. As shown in FIG. 3 and illustrated in the first embodiment, the insulated cover 115 includes the first contact 111 and the second contact 112. When the insulated cover 115 is extruded by the positioning bolt 105, the elastic spacer 116 is compressed, such that the first contact 111 and the second contact 112 are contacted with each other, thereby forming a conducting circuit. When the insulated cover 115 is released or decompressed, the elastic spacer 116 will separate the first contact 111 and the second contact 112, such that the circuit between the first contact 111 and the second contact 112 is isolated.

In the first embodiment, the first contact 111 is connected to a battery management unit, and the second contact 112 is connected to a voltage detecting probe or a voltage detecting connector, which is used for receiving a voltage signal from the electrode. Therefore, a stable voltage signal is continuously received by the battery management unit when the first contact 111 is contacted with the second contact 112, and the voltage signal will be lost when the first contact 111 and the second contact 112 are isolated.

Figure 4:
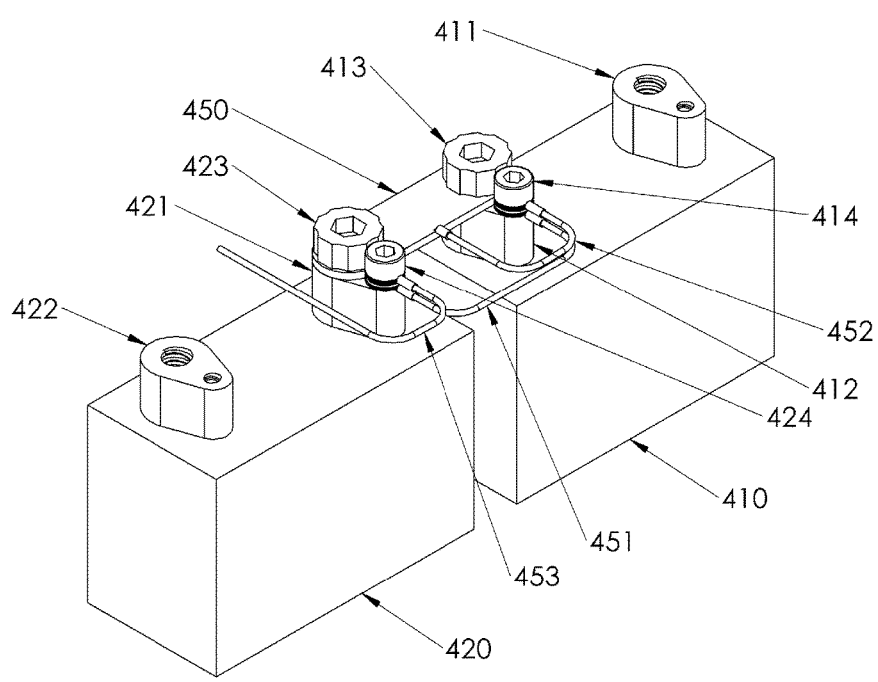
FIG. 4 schematically illustrates an isometric view of a locking confirmation device according to the second embodiment of the present invention.

Please refer to FIG. 4. A locking confirmation device of multiple electrode contacts according to the second embodiment of the present invention will be illustrated. Multiple detection sensor assemblies are installed to a first battery 401 and a second battery 402. The first battery 401 and the second battery 402 are connected in parallel.

The second embodiment discloses a method of detecting the locking states of multiple electrodes by transmitting a voltage signal through multiple detection sensor assemblies when two batteries are connected in parallel. The negative electrode 412 of the first battery 410 and the negative electrode 421 of the second battery 420 have the same potential.

A positioning bolt 414 is used for confirming the locking state of an electrode thread 413 of the negative electrode 412 of the first battery 410. It is characterized in that a detection sensor assembly is also fixed on the positioning bolt 414, and installed on the positioning thread of the negative electrode 412 of the first battery 410 as described in the first embodiment.

A positioning bolt 424 is used for confirming the locking state of an electrode thread 423 of the negative electrode 421 of the second battery 420. It is characterized in that a detection sensor assembly is also fixed on the positioning bolt 414, and installed on the positioning thread of the negative electrode 421 of the second battery 420 as described in the first embodiment.

A voltage information signal from the negative electrode 412 of the first battery 410 and the negative electrode 421 of the second battery 420 are transmitted to a conductor 450 and an input wire 452. When this two detection sensor assemblies related with the positioning bolt 414 and the positioning bolt 424 are extruded that makes a current passing through a first contact and a second contact, the current information signal is transmitted, through the input wire 452, an interconnecting wire 451, and an output wire 453 of a battery management unit (not shown), to the battery management unit for returning the voltage information.

When a related positioning bolt of one of the detection sensor assemblies is loosened, the extruded state will be lost, such that the electric conduction between the first contact and the second contact will be broken. Under this circumstance, the battery management unit will lose the voltage information signal. Therefore, the loss of the voltage information signal can be utilized as an indication of loosening possibility of the electrode contacts by a vehicle management unit, and the vehicle management unit related with the battery management unit can notice a user or a service officer to operate a necessary detection on the electrode contacts.

Figure 5:
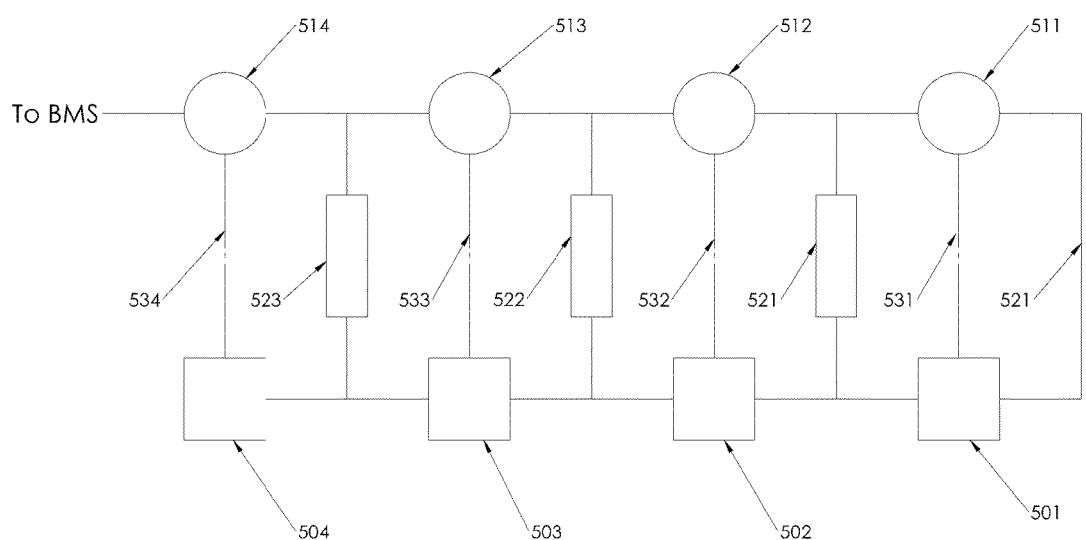
FIG. 5 schematically illustrates a wiring configuration of multiple battery modules in parallel according to the second embodiment of the present invention.

Please refer to FIG. 5. The advanced examples of the second embodiment are illustrated in FIG. 5. Blocks 504, 503, 502 and 501 respectively represent detection sensor assemblies for returning the locking states of the corresponding electrodes of the corresponding batteries and the voltage signals of designated nodes of the parallel battery modules. Wires 534, 533, 532 and 531 are used for connecting the detection sensor assemblies of the corresponding electrodes.

As shown in FIG. 5, bias resistors 523, 522 and 521 are used for generating a voltage divider circuit, which is capable of detecting the locking states of multiple electrodes of batteries and identifying fault electrode contacts when a terminal bolt of any battery is loosened. When all detection sensor assemblies are locked tightly, the voltage information signal is directly read by the battery management unit through the wires 520 and 534, and all voltage values of the nodes of the electrodes are obtained by the battery management unit. When one of the detection sensor assembly is loosened, the electric connection between the wires 520 and 534 is not conducted, the voltage information signal of nodes of the electrodes can be read by the battery management unit through the corresponding bias resistors and a reduced voltage value is obtained by the battery management unit. Therefore, the fault electrodes with fault electrode contact can be determined and identified through the reduced voltage signal and the calculation of the voltage value of the voltage divider circuit by the vehicle management unit related with the battery management unit.

Through the implementation of the embodiment shown in FIG. 5, the fault electrode contacts can be noticed to the user by the vehicle management unit before the loosening of an electrode or a conductor. Since the loosened positioning bolt is identified through the reduced voltage signal by the vehicle management unit, the terminal bolt is still located in the electrode thread. That is, it provides a warning of detecting fault electrode contacts to the driver or the service officer.

What is claimed is:

1. A locking confirmation device of multiple electrode contacts, the locking confirmation device comprising:
   an electrode comprising an electrode thread and a positioning thread;
   a terminal bolt for locking a conductor and the electrode thread, wherein the terminal bolt comprises at least one positioning recess;
   a sensing unit comprising an insulated cover, a first contact, a second contact, an elastic member and an voltage signal input connector, wherein when the elastic member is extruded, a circuit is formed for returning a voltage signal of a node of the electrode; and
   a positioning bolt for fixing a detection sensor assembly on the positioning thread, wherein when a head portion of the positioning bolt is received within the positioning recess, the terminal bolt is led to a locking state by the head portion of the positioning bolt.

2. The locking confirmation device of multiple electrode contacts according to claim 1 further comprising an extra detection sensor assembly of an extra electrode, wherein the extra electrode and the electrode have the same potential.

3. The locking confirmation device of multiple electrode contacts according to claim 2 further comprising at least a bias resistor for forming a voltage divider circuit, wherein when the elastic member is not extruded, an unique drop voltage signal is transmitted to a battery management component.

4. The locking confirmation device of multiple electrode contacts according to claim 3 further comprising a control unit for identifying fault electrode contacts through measuring the unique drop voltage signal.

5. A locking confirmation device for detecting fault electrode contacts of nodes of multiple electrodes comprising at least two detection sensor assemblies and a voltage signal input connector, wherein each detection sensor assembly comprises an insulation assembly, a first contact, a second contact and an elastic member, and wherein when the elastic member is extruded by a locking of a positioning bolt and a related terminal bolt, a circuit is formed for conducting the first contact and the second contact.

* * * * *